United States Patent [19]

Nakayama et al.

[11] Patent Number: 5,155,566
[45] Date of Patent: Oct. 13, 1992

[54] ORGANIC THIN FILM ELEMENT

[75] Inventors: Toshio Nakayama, Fujisawa; Nobuhiro Gemma, Yokohama; Akira Miura, Toride; Katsuyuki Naito; Syun Egusa, both of Yokohama, all of Japan

[73] Assignee: Kabushiki Kaisha Toshiba, Kawasaki, Japan

[21] Appl. No.: 675,964

[22] Filed: Mar. 27, 1991

[30] Foreign Application Priority Data

Mar. 27, 1990 [JP] Japan .................. 2-75413

[51] Int. Cl.$^5$ .................. H01L 27/14; H01L 31/00
[52] U.S. Cl. .................. 357/30; 357/8
[58] Field of Search .................. 357/30 R, 8

[56] References Cited

U.S. PATENT DOCUMENTS 4,907,043  3/1990  Uekita et al. .................. 357/8

OTHER PUBLICATIONS

Physical Review Letters, vol. 52; Jun. 18, 1984; Y. Harada et al; "Selective Observation of Outermost Surface Layer during . . . "; pp. 2269-2272.

J. Chem. Soc. Faraday I, vol. 76; Jan. 1980; Peter Meehan et al; "Neutron Diffraction from Benzene Adsorbed on Graphite"; pp. 2011-2016.

Primary Examiner—John D. Lee
Assistant Examiner—Robert E. Wise
Attorney, Agent, or Firm—Oblon, Spivak, McClelland, Maier & Neustadt

[57] ABSTRACT

An organic thin film element has a structure in which an organic thin film layer, an insulating layer, and a back electrode are sequentially formed on a substrate obtained by forming an electrode, an insulating layer and a layer consisting of polycyclic aromatic group molecules or a derivative thereof or a carbon layer having a graphite structure on the surface of a substrate main body. An effect of controlling the orientation of the organic thin film layer can be enhanced by the surface layer of the substrate similar in chemical structure to molecules constituting the organic thin film layer. A neutral-ionic transition of a complex can be effectively caused by an electric field applied from the electrodes.

14 Claims, 1 Drawing Sheet

ORGANIC THIN FILM ELEMENT

BACKGROUND OF THE INVENTION 1. Field of the Invention

The present invention relates to an organic thin film element. 2. Description of the Related Art In recent years, attention has been increasingly paid to molecular electronics using various physical properties of organic molecules to realize devices having novel functions not obtained by conventional semiconductor devices. For example, studies for applying organic molecules to a non-linear optical element, a switching element, and an electric-field light-emitting element have been actively made. From the viewpoint of the application of organic molecules to these elements, especially a charge-transfer phenomenon occurring between organic molecules has attracted attention.

Organic materials consist of donor molecules each having a low ionization potential and a tendency to give an electron to another molecule to become a positive ion and acceptor molecules each having a high electron affinity and a tendency to receive an electron from another molecule. It is well known that a compound called a charge-transfer complex is formed between these two types of molecules. For example, a compound of perylene and tetracyanoquinodimethane (TCNQ) consists of neutral molecules. On the other hand, a compound of tetramethylphenylenediamine (TMPD) and TCNQ is an ionic compound in which molecules of the respective substances become positive and negative ions. It is also known that a neutral-ionic transition phenomenon according to a change in temperature or pressure is observed in a compound of tetrathiafulvalene (TTF) and chloranil (CA) (J. B. Torrance et al.: Phys. Rev. Lett., 46, 253 (1981)).

To apply the charge-transfer phenomenon in organic molecules as the operational principle of an electrical or optical element, it is important to cause charge-transfer using an electric field or light with high efficiency and controllability. Data of interest, relating to electrical characteristics of the charge-transfer complex, has recently been reported (Yoshiki Tokura et al.: Manuscripts for Meeting of the Physical Society, 3a-S4-1, 3a-S4-2, 3a-S4-3, etc. (Autumn 1988); Y. Tokura et al.: Physica 143B, 527 (1986)) Namely, it is reported that in a mixed stacked complex crystal in which donor molecules and acceptor molecules are stacked with their molecular planes facing each other, the anisotropy of relative dielectric constant is high, the relative dielectric constant in the direction of stacking is very high, i.e., 100 to 1,000, and non-linear electric conductivity or switching characteristics are observed under an electric field on the order of $10^3$ to $10^4$ V/cm. The reason for this is assumed that an ionic domain thermally or electrically formed in a neutral crystal or a neutral domain formed in an ionic crystal is dynamically moved by an electric field.

This phenomenon, though relating to neutral-ionic transition, occurs in a very local area, and no macroscopic change appears in the whole crystal. No macroscopic neutral-ionic transition caused by an electric field or light has yet been realized.

To cause a macroscopic neutral-ionic transition in a charge-transfer complex using an electric field, it is very important that the direction of the electric field in an element coincides with the direction of a stacking axis of donor and acceptor molecules. To realize devices effectively using the characteristics of organic molecules as described above, control of a molecular structure on the order of a single molecule in a film, a mutual arrangement between neighboring molecules, and a molecular orientation is very important as well as dimensions such as a film thickness and structural uniformity.

Recently, as a method of manufacturing a very thin film having controlled molecular orientation and structure, a Langmuir-Blodgett (LB) method has become a big concern. In this method, monomolecular films formed on a water surface are accumulated on a substrate one by one to form superlattice films of the same type or different types. Actually, however, a packing state or uniformity of molecules in a film developed on the water surface is poor, and a monomolecular film structure is disturbed when it is accumulated on the substrate. Therefore, this method has not yet reached the level capable of forming a superlattice thin film having a controlled molecular orientation in the entire film or between the accumulated layers. To improve the film formation techniques according to the LB method, it is necessary to design molecules suitable for the LB method and to establish a synthesizing technique for such molecules.

On the other hand, as a technique requiring no specific molecular design and capable of being easily applied to most of organic molecules, a vacuum deposition method has been actively studied. In the vacuum deposition method, however, a molecule evaporation source is temporarily gasified and aggregated again. Therefore, it is predicted that a film structure or a molecular orientation variously changes depending on a balance between the supply rate of gasified molecules, the rate of surface diffusion or crystallization of molecules deposited on a substrate surface and an interaction between adsorbed molecules and the substrate surface.

In the conventional studies about an organic deposited film, a thin film growth process and a molecular orientation of mainly long-chain hydrocarbon-based linear molecules or tabular molecules such as phthalocyanine on various types of substrates have been examined. A single-crystal alkali halide or a single-crystal metal, quartz, and an Si single crystal are mainly used as substrates to execute evaluation using an electron microscope or electron-beam diffraction, optical evaluation, and electrical evaluation, respectively. As the deposition conditions, influences of a substrate temperature and a deposition rate have been checked in many cases. Vincett et al. in U.S.A. has reported that a uniform continuous film can be formed by setting a substrate temperature (on the absolute temperature scale) to be ⅓ the boiling point of a deposition material regardless of the types of the deposition material and the substrate. However, it is very difficult to control the orientation of an organic thin film deposited on a given substrate simply by setting proper deposition conditions.

The following reports are known as researches on influences of a substrate on the molecular orientation of an organic thin film formed thereon. (1) Karl et al. in West Germany have reported that in a perylenetetracarboxy dianhydride deposition film of several molecular layers formed on a pure Si single-crystal surface, molecular planes are oriented parallel to the substrate surface. (2) Hara has reported, in the research on a phthalocyanine deposited film using a molecular-beam deposition method, that even under the conditions in that only a discontinuous film can be formed by normal high-vacuum deposition, a uniform continuous film in which molecular surfaces are oriented parallel to a substrate surface can be formed at a very low deposition rate of about 0.1 nm/min under vary high vacuum. In this research, to avoid lattice mismatching between an inorganic substrate and deposited organic crystals, MoS$_2$ which is a layered compound is used as a substrate on the basis of the idea of Van der Waals epitaxy. (3) Harada et al. have reported that molecular planes are oriented parallel to a substrate surface in a pentacene deposited film of several molecular layers formed on a graphite substrate.

Although the various types of studies have been made on thin film formation according to the vacuum deposition method as described above, control factors of the film structure and the molecular orientation have not yet been totally understood.

The present inventors have made extensive studies with an emphasis on an interaction between a substrate and deposited molecules. As a result, the present inventors have found that, when a film of aromatic group-based molecules is to be deposited, a uniform continuous film can be easily formed by using a highorientation graphite substrate having high similarity to a deposited film in terms of a chemical structure and an electronic structure and setting proper deposition conditions. In addition, it is assumed that a factor determining the orientation of an aromatic group-based molecules deposited on a high-orientation graphite substrate is a Van der Waals interaction occurring between η electrons on the surface of the graphite substrate and those of the aromatic group-based molecules. That is, it is assumed that the molecules are stabilized most in terms of energy by this interaction while their main molecular planes are oriented parallel to the substrate. However, it is difficult to form an element as an electronic or optical device using a graphite substrate.

As described above, to cause a neutral-ionic transition according to an electric field in a charge-transfer complex of donor and acceptor molecules, the direction of stacking axis of the complex must coincide with the application direction of the electric field. However, it is very difficult to control the orientation of an organic thin film on a given substrate simply by setting proper thin film formation conditions. If a graphite substrate is used and the formation conditions of an organic thin film are properly set, the orientation of the organic thin film can be easily controlled. However, it is difficult to form an element as an electronic or optical device using a graphite substrate.

SUMMARY OF THE INVENTION

It is an object of the present invention to provide an organic thin film element in which the structure and the orientation of an organic thin film can be controlled regardless of the material of a substrate and the type of stacking structure of layers and which can be put into practical use as a display element or the like.

According to the present invention, there is provided an organic thin film element comprising a substrate and an organic thin film layer formed on the substrate and containing donor and acceptor molecules, wherein the substrate comprises a substrate main body and a layer consisting of polycyclic aromatic group molecules or a derivative thereof or a carbon layer having a graphite structure is formed on the surface of the substrate main body.

According to the organic thin film element of the present invention, since the surface of the substrate consists of the polycyclic aromatic group molecules or the derivative thereof or the carbon layer having a graphite structure any of which has a controlled orientation, the orientation of the organic thin film layer formed on the substrate surface is improved. As a result, a neutral-ionic transition of a charge-transfer complex in the organic thin film layer can be effectively controlled by an electric field. Such an effect of controlling the molecular orientation of an organic thin film layer can be applied to any device using an organic thin film such as a display element, a non-linear optical element, a switching element, an electric field light-emitting element, and an optical information recording medium.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

The present invention will be described in more detail below with reference to the accompanying drawings.

An organic thin film element of the present invention basically has a structure in which an organic thin film containing both donor and acceptor molecules is formed on a substrate (on the surface of which a layer consisting of polycyclic aromatic group molecules or a derivative thereof or a carbon layer having a graphite structure is formed). Note that in a practical element, a substrate is used which an electrode, an insulating layer, and the layer consisting of polycyclic aromatic group molecules or a derivative thereof or the carbon layer having a graphite structure are formed on a substrate main body, and the organic thin film layer, an insulating layer, and a back electrode are sequentially formed thereon. The organic thin film layer may have a superlattice structure.

In the present invention, the material of the substrate main body is not particularly limited but may be, e.g., a metal, a semiconductor (including those having circuits or junctions), a dielectric, and quartz. Examples of the electrode to be formed on the surface of substrate main body are a metal thin film and an ITO (indium tin oxide). When an insulating layer is formed on the electrode surface, this insulating layer functions to effectively apply an intense electric field on the organic thin film layer. That is, in general, as the intensity of an electric field to be applied to an organic thin film layer is increased, an amount of a current flowing through the organic thin film layer is largely increased. Therefore, the intensity of an electric field is limited to a certain level. On the other hand, when an insulating layer is formed between the electrode and the organic thin film layer, an amount of a current flowing through the organic thin film layer is not increased even if an intense electric field is applied. Therefore, an intense electric field can be effectively applied to the organic thin film layer to effectively cause charge transfer. Examples of the insulating layer are $SiO_2$, $SrTiO_3$, and an organic polymer. To apply a higher electric field to the organic thin film layer, it is preferred to use an insulating material having a relative dielectric constant of 10 or more, e.g., a ferroelectric such as $SrTiO_3$.

In addition, to form a carbon layer having a graphite structure on the surface of the substrate main body, it is preferred to form a thin film underlayer consisting of a transition metal having d or f electrons such as Pt, Pd, Ni, Ir, Rh, Co, Os, Ru, Fe, Re, Pr, Nd, Sm, Eu, Gd, Tb, Dy, Ho, or Yb or a transition metal carbide such as WC, TiC, TaC, or HfC.

In the present invention, examples of the polycyclic aromatic group molecules and the derivative thereof constituting the surface layer of the substrate are a benzenoid-based condensed aromatic group, a bicyclic or polycyclic ring group, a non-benzenoid-based aromatic group, a heterocyclic aromatic group, a condensed aromatic group derivative, a macrocyclic aromatic group, and an aromatic group-based polymer.

Examples of the benzenoid-based condensed aromatic group are naphthalene, anthracene, pentacene, hexacene, heptaphene, triphenylene, benz[a]anthracene, chrysene, benzo[c]phenanthrene, picene, dibenz[a,j]anthracene, dibenz[a,c]anthracene, dibenz[a,h]anthracene, naphth[2,3-a]anthracene, naphth[2,1-a]anthracene, benzo[a]naphthacene, naphtho[2,3-a]naphthacene, dibenzo[a,l]naphthacene, dibenzo[a,j]naphthacene, dibenzo[c,g]phenanthrene, pyrene, perylene, 1,12-benzopyrene, naphtho[2,1-a]pyrene, dinaphthoanthracene, terylene, quarterylene, benzo[a]pyrene, benz[e]pyrene, [18]annulene, 2,3;8,9-dibenzoperylene, anthracen[2,1-a]anthracene, phenanthren[2,3-a]anthracene, tribenz-[a,c,h]anthracene, naphtho[2,3-a]pyrene, dibenzo[a,i]pyrene, dibenzo[a,l]pyrene, cedrene, anthantholene, tetrabenzonaphthalene, coronene, tetrabenz[a,c,h,j]anthracene, pyranthrene, bisanthrene, benzobisanthrene, 1,2;7,8-dibenzocoronene, 2,3;8,9-dibenzocoronene, ovalene, hexabenzocoronene, tribenzo[a,i,l]pyrene, violanthrene, tetrabenzo[a,cd,j,lm]perylene, diphenanthroperylene, anthrabenzonaphthopentacene, 1,9,5,10-diperynaphthyleneanthracene, dinaphtho[7',1';1,13;1'',7'';6,8]peropyrene, decabenzanthracene, and diphenylenenaphthacene. Examples of the ring group are biphenyl, terphenyl, and quarterphenyl. Examples of the non-benzenoid-based aromatic group are fluorene, fluoranthene, decacyclene, diindeno[1,2,3-cd;1',2',3'-lm]perylene, and azulene. Examples of the heterocyclic aromatic group are carbazole, acridine, phenazine, and thianthrene. Examples of the condensed aromatic group derivative are perylenequinone, violanthrone, isoviolanthrone, naphthalic anhydride, naphthalenetetracarboxylic dianhydride, and perylenetetracarboxylic dianhydride. Examples of the macrocyclic aromatic group are keclene, phthalocyanine, and porphyrin. Examples of the aromatic group-based polymer are polyparaphenylenevinylene, polyimide, polyamide, polyoxadiazole, and polybenzimidazole.

Note that, when these polycyclic aromatic group molecules and their derivatives independently have donor or acceptor properties, the donor or acceptor properties are too weak to be put into practical use.

The substrate surface layer consisting of polycyclic aromatic molecules or a derivative thereof can be formed by a vacuum deposition method, an adsorption method, an LB method, a method of forming a film via a chemical bonding, or a heat polymerization method. Charged particles may be radiated on a film formed by these methods.

More specifically, the adsorption method includes, e.g., a method in which a substrate main body is dipped in a solution of polycyclic aromatic group molecules or a derivative thereof and a solvent is evaporated; and a method in which a substrate main body is left to stand in a vapor of polycyclic aromatic group molecules or a derivative thereof.

When the LB method is to be used, a derivative is synthesized by introducing at least one hydrophobic group to polycyclic aromatic group molecules, and a substrate main body is subjected to a hydrophobic treatment beforehand. A solution of the polycyclic aromatic group molecular derivative is dropped on a water surface to develop a monomolecular film, and the developed monomolecular film is compressed and accumulated on the substrate main body by either a horizontal adhesion method or a vertical dipping method. In this method, by setting the number of hydrophobic groups and the surface pressure of the monomolecular film to be proper values, a layer in which main molecular planes of the polycyclic aromatic molecules are oriented parallel to the surface of the substrate main body can be formed.

An example of the method of forming a film via a chemical bonding is a method in that a silane derivative of polycyclic aromatic group molecules is used to cause a condensation reaction with hydroxyl groups on the surface of an insulating layer (e.g., $SiO_2$) on the substrate main body, thereby forming a film consisting of the polycyclic aromatic group molecular derivative. Especially when a plurality of functional groups for causing the condensation reaction are introduced to the polycyclic aromatic group molecules, the molecular planes of the polycyclic aromatic group molecules can be easily oriented parallel to the substrate main body. Examples of the polycyclic aromatic group molecular derivative usable in the present invention are a chlorosilane derivative such as a dichlorodimethylsilyl derivative, a dichlorodiphenylsilyl derivative, a trichlorosilyl derivative, a bis(trichlorosilyl) derivative, a tris(trichlorosilyl) derivative, and a tetrakis(trichlorosilyl) derivative. In addition, a derivative obtained by introducing a titanate coupling agent or a metal complex surface modifier used in a metal surface treatment to polycyclic aromatic group molecules can be used. To the contrary, the surface of a substrate main body may be modified by a $YRSiX_3$-type silane coupling agent containing an epoxy group or an amino group to cause the condensation reaction with polycyclic aromatic group molecules or a derivative thereof.

In the heat polymerization method, after a film consisting of a crosslinking polycyclic aromatic group molecular derivative, a film mixture of polycyclic aromatic group molecules or a derivative thereof with a crosslinking agent, or a film of an aromatic group polymer is formed on a substrate main body, a heat treatment is performed to polymerize or condense the molecules in the film, thereby forming a larger polycyclic aromatic group molecular skeleton.

When charged particles are radiated on a film formed by a method except for the heat polymerization method, polycondensation between the molecules is accelerated to form a larger polycyclic aromatic group molecular skeleton. Examples of the charged particles are an electron beam, an ion beam, and plasma. When charged particles are used, molecules can efficiently undergo polycondensation without requiring a high temperature unlike in the heat polymerization. In addition, by radiating a patterned beam of charged particles, a predetermined pattern of a film having a larger polycyclic aromatic group molecular skeleton can be formed, and a pattern of an organic thin film layer can be formed thereon so as to be self-aligned therewith.

The carbon layer having a graphite structure is formed by adsorbing hydrocarbon on the surface of the substrate main body and thermally decomposing the adsorbed hydrocarbon. Such a thermal structural change in the surface-adsorbed species is reported by Lang et al. ("Surface Science", 53, (1975) 317). In this case, if a thin film of a transition metal or a transition metal carbide is formed on the surface of the substrate main body as described above, the thermal structural change in adsorbed hydrocarbon can be accelerated. More specifically, when several tens to several hundreds Langmuir of hydrocarbon gas such as ethylene or acethylene are adsorbed at a substrate temperature of 500 to 1,500 K, a dehydrogenation reaction progresses to form a carbon layer having a graphite structure.

By these methods, polycyclic aromatic group molecules or carbon layer having a graphite structure can be formed on the surface of the substrate main body with their molecular planes oriented parallel to the surface of the substrate main body. As a result, a surface structure similar to the cleavage plane of a graphite single crystal can be obtained.

In the present invention, as the organic thin film containing both the donor and acceptor molecules, a mixed stacked charge-transfer complex crystal in which the molecules are stacked with their molecula planes facing each other is preferably used. When the mixed stacked charge-transfer complex is used, a structure in which the donor and acceptor molecules are alternately stacked is automatically constructed during a film growth step, thereby increasing the efficiency of charge transfer.

Examples of the mixed stacked charge-transfer complex are phenothiazine-TCNQ, tetradiaminopyrene-TCNQ, TTF-chloranil, TTF-fluoranil, dibenzoTTF-TCNQ, diethyldimethyltetraselenafulvalene-diethylTCNQ, tetradiaminopyrene-fluoranil, TTF-dichlorodicyanobenzoquinone, perylenetetracyanoethylene, perylene-TCNQ, TTF-dinitrobenzene, perylene-chloranil, pyrene-tetracyanoethylene, pyrene-chloranil, anthracene-chloranil, hexamethylbenzene-chloranil, naphthalene-tetracyanoethylene, anthracene-pyromellitic dianhydride, anthracenetetracyanobenzene, and phenanthrene-pyromellitic dianhydride.

If the thickness of the organic thin film layer containing both the donor and acceptor molecules is large, the level of an effective electric field to be applied to the film is decreased by an electric field formed by carriers generated in the film. However, if the thickness of the film is its Debye length (abou 30 nm) or less, the decrease of the electric field formed by the carriers can be prevented. In addition, if the complex is ionic, by reducing contribution of a Madelung energy term of complex stabilizing energy by decreasing the film thickness, the complex transits to be neutral. Therefore, the charge-transfer state of the complex can be set close to boundary conditions of transition.

The organic thin film layer may have a superlattice structure in which a plurality of complex layers and layers consisting of polycyclic aromatic are stacked. With this structure, changes in neutral-ionic states of the plurality of complexes can be controlled by a voltage change.

In the present invention, when an insulating layer is to be formed on the organic thin film layer, an organic polymer film is preferably formed by the vacuum deposition method to prevent the organic thin film from being adversely affected. A metal thin film or the like can be used as the back electrode.

In the organic thin film element of the present invention, a layer in that main molecular planes of polycyclic aromatic group molecules, on the molecular planes of which $\eta$ electrons spread, are oriented parallel to the substrate main body, or a carbon layer having a graphite structure is formed. Therefore, a surface electron structure similar to the cleavage plane of a graphite single crystal can be obtained on a given substrate main body. In addition, since the chemical structure of the substrate surface is similar to that of the molecules constituting the organic thin film layer formed on the substrate, an effect of controlling the orientation of the organic thin film layer is enhanced. Therefore, since the neutral-ionic transition in a complex can be effectively caused by an electric field, an organic thin film element which can be put into practical use as, e.g., a display element can be provided. Similarly, by arbitrarily setting the electrical characteristics or the optical characteristics of the substrate main body, an organic thin film element having desired functions can be manufactured.

The structures and the operational principles of the organic thin film elements according to the present invention will be briefly described below.

(a) Display Element

A display element according to the present invention has a structure in that an organic thin film layer, an insulating layer, and a back electrode are sequentially formed on a substrate constituted by a transparent substrate main body, a transparent electrode, an insulating layer, and a layer consisting of polycyclic aromatic group molecules or a derivative thereof or a carbon layer having a graphite structure. In this display element, an electric field is applied from the electrodes to the organic thin film layer. As a result, since a mixed stacked charge-transfer complex constituting the organic thin film layer is caused to transit from a neutral to ionic state to change its light absorption wavelength, a display function can be obtained.

(b) Field-Effect Transistor (FET)

An FET according to the present invention has a basic structure in that a gate insulating film, a layer consisting of polycyclic aromatic group molecules or a derivative thereof or a carbon layer having a graphite structure, an organic thin film layer, and a gate electrode are sequentially formed on a channel region defined between source and drain regions formed on the surface of a semiconductor substrate.

In this FET, when a gate voltage is gradually increased, a mixed stacked charge-transfer complex constituting the organic thin film layer transits from a neutral to ionic state at a certain voltage level to abruptly increase a drain current. As a result, a switching function is obtained.

Note that in either of the above two devices, a multivalue display or switching function can be obtained by adopting a superlattice structure in the organic thin film layer.

The present invention will be described in more detail below by way of its examples. In the following examples, organic thin film layers having structures shown in FIGS. 1 to 3 are formed.

Figure 1:
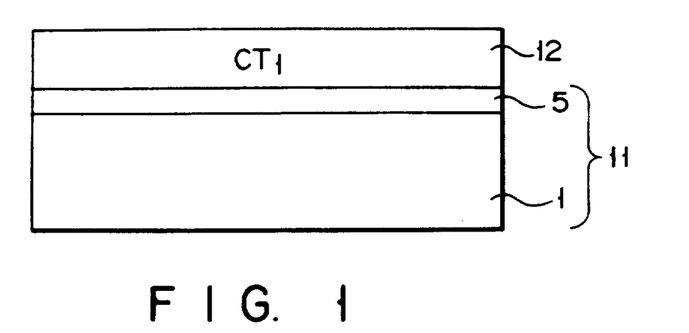
FIG. 1 is a sectional view showing an organic thin film element according to the present invention.

In the organic thin film element shown in FIG. 1, a layer 5 which is either a layer consisting of polycyclic aromatic group molecules or a derivative thereof or a carbon layer having a graphite structure is formed on the surface of a substrate main body 11, and an organic thin film layer 12 is formed thereon.

Figure 2:
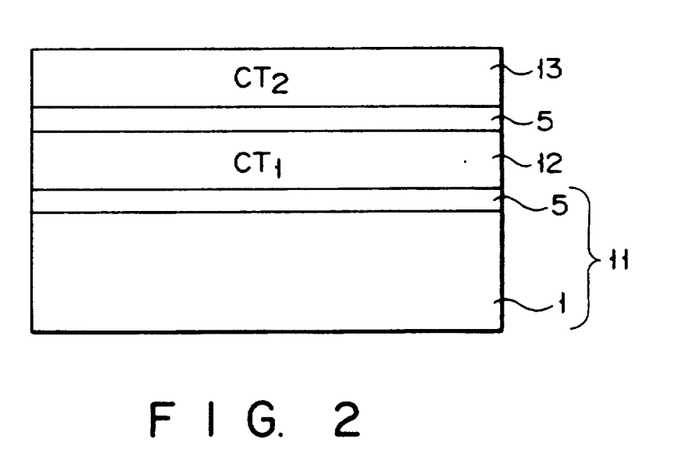
FIG. 2 is a sectional view showing another organic thin film element according to the present invention.

The organic thin film element shown in FIG. 2 has a superlattice structure in that a layer 5 consisting of polycyclic aromatic group molecules or a derivative thereof is formed on the surface of a substrate main body 11, and a first organic thin film layer 12, a layer 5 consisting of a polycyclic aromatic group molecules or a derivative thereof, and a second organic thin film layer 13 are sequentially formed thereon.

Figure 3:
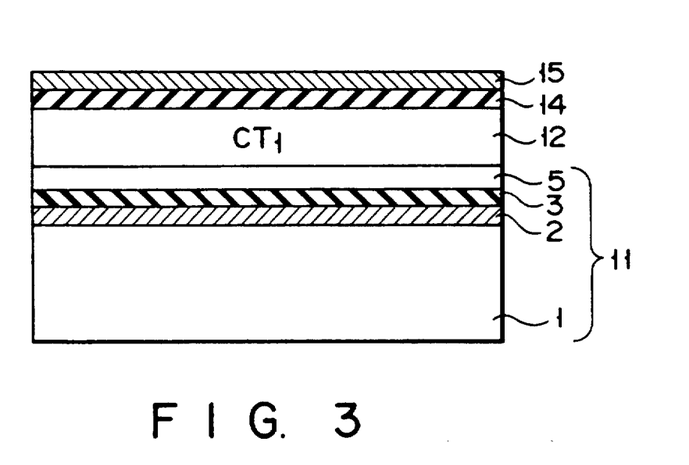
FIG. 3 is a sectional view showing an organic thin film display element according to the present invention.

In the organic thin film element shown in FIG. 3, an electrode 2, an insulating layer 3, and a layer which is either a layer consisting of polycyclic aromatic group molecules or a derivative thereof or a carbon layer 5 having a graphite structure are formed on the surface of a substrate main body 11, and an organic thin film layer 12, an insulating layer 14, and a back electrode 15 are sequentially formed.

EXAMPLE 1

A decacyclene film having a film thickness of about 10 nm was formed on an Si substrate main body at a substrate temperature of 50° C. by a vacuum deposition method. A TCNQ film having a film thickness of about 100 nm was formed on the resultant substrate by the vacuum deposition method.

When the film was observed by a scanning electron microscope (SEM), it was confirmed that a uniform continuous film in which the size of one domain reached 10 μm was formed. In addition, the orientation of the film was checked by an X-ray diffraction method. As a result, it was confirmed that molecular planes on one side of TCNQ crystal unit cells having a herring bone structure were oriented parallel to the substrate surface.

EXAMPLE 2

A violanthrene film having a film thickness of about 5 nm was formed on an Si substrate main body at a substrate temperature of 55° C. by the vacuum deposition method. A phthalocyanine film having a film thickness of about 500 nm was formed on the resultant substrate by the vacuum deposition method.

When the film was observed by the SEM, it was confirmed that a uniform continuous film in which the size of one domain reached 10 μm was formed. In addition, the orientation of the film was checked by the X-ray diffraction method. As a result, it was confirmed that molecular planes on one side of phthalocyanine crystal unit cells having a herringbone structure were oriented parallel to the substrate surface.

EXAMPLE 3

A violanthrene film having a film thickness of about 5 nm was formed on an Si substrate main body at a substrate temperature of 55° C. by the vacuum deposition method. A phenothiazine-TCNQ film having a film thickness of about 10 nm was formed on the resultant substrate by the vacuum deposition method.

When the film was observed by the SEM, it was confirmed that a uniform continuous film in which the size of one domain reached 10 μm was formed. In addition, the orientation of the film was checked by the X-ray diffraction method. As a result, it was confirmed that molecular planes of complex crystal unit cells were oriented substantially parallel to the substrate surface.

EXAMPLE 4

A violanthrene film having a film thickness of about 5 nm was formed on an Si substrate main body at a substrate temperature of 55° C. by the vacuum deposition method. A TCNQ film having a film thickness of about 100 nm, a violanthrene film having a film thickness of about 5 nm, and a phenothiazine-TCNQ film having a film thickness of about 10 nm were formed on the resultant substrate by the vacuum deposition method.

When the film was observed by the SEM, it was confirmed that a uniform continuous film was formed throughout several μm. In addition, the orientation of the film was checked by the X-ray diffraction method. As a result, it was confirmed that molecular planes of complex crystal unit cells were oriented substantially parallel to the substrate surface.

EXAMPLE 5

An Si substrate main body was dipped in a toluene solution of coronene and heated at 80° C. to evaporate the solvent, thereby forming a coronene film. A phenothiazine-TCNQ film having a film thickness of about 30 nm was formed on the resultant substrate at a substrate temperature of 50° C. by the vacuum deposition method.

When the film was observed by the SEM, it was confirmed that a uniform continuous film in which the size of one domain reached 10 μm was formed. In addition, the orientation of the film was checked by the X-ray diffraction method. As a result, all molecular planes of a phenothiazine-TCNQ complex were oriented substantially parallel to the substrate surface.

EXAMPLE 6

An Si substrate main body was dipped in a toluene solution of coronene and heated at 80° C. to evaporate the solvent, thereby forming a coronene film. A violanthrene film having a film thickness of 2 nm and a phenothiazine-TCNQ film having a film thickness of about 30 nm were formed on the resultant substrate at a substrate temperature of 50° C. by the vacuum deposition method.

When the film was observed by the SEM, it was confirmed that a uniform continuous film in which the size of one domain reached 10 μm was formed. In addition, the orientation of the film was checked by the X-ray diffraction method. As a result, all molecular planes of a phenothiazine-TCNQ complex were oriented substantially parallel to the substrate surface.

EXAMPLE 7

An ITO transparent electrode having a film thickness of 400 nm and an $SiO_2$ film having a film thickness of 200 nm as an insulating layer were formed on a quartz substrate main body. The resultant substrate was dipped in a toluene solution of coronene and heated at 80° C. to evaporate the solvent, thereby forming a coronene film. A violanthrene film having a film thick ness of 2 nm and a phenothiazine-TCNQ film having a film thickness of about 30 nm were formed on the substrate at a substrate temperature of 50° C. by the vacuum deposition method. In addition, a polyisobutylmethacrylate film having a film thickness of 20 nm as an insulating layer and an Au semitransparent electrode having a film thickness of 25 nm were formed on the phenothiazine-TCNQ film to manufacture an organic thin film element.

When no voltage was applied, the organic thin film layer of this element exhibited an orange color. When a voltage was applied to the organic thin film layer, the color of the layer changed to dark red at a voltage of about 30 V.

EXAMPLE 8

An Si substrate main body was left to stand in a hexamethyldisilazane vapor phase for a hydrophobic treatment. A monomolecular film containing tetra t-butylphthalocyanine and octadecane at a mixing ratio of 1 : 4 was developed on a water surface, and three layers of this monomolecular film were accumulated on the substrate main body. A phenothiazine-TCNQ film having a film thickness of about 30 nm was formed on the resultant substrate at a substrate temperature of 50° C. by the vacuum deposition method.

When the film was observed by the SEM, it was confirmed that a uniform continuous film in which the size of one domain reached 10 μm was formed. In addition, the orientation of the film was checked by the X-ray diffraction method. As a result, it was confirmed that all molecular planes of a phenothiazine-TCNQ complex were oriented substantially parallel to the substrate surface.

EXAMPLE 9

An Si substrate main body was left to stand in a hexamethyldisilazane vapor phase for a hydrophobic treatment. A monomolecular film containing tetra t-butylphthalocyanine and octadecane at a mixing ratio of 1 : 4 was developed on a water surface, and three layers of this monomolecular film were accumulated on the substrate main body. A violanthrene film having a film thickness of 3 nm and a phenothiazine-TCNQ film having a film thickness of about 30 nm were formed on the resultant substrate at a substrate temperature of 55° C. by the vacuum deposition method.

When the film was observed by the SEM, it was confirmed that a uniform continuous film in which the size of one domain reached 10 μm was formed. In addition, the orientation of the film was checked by the X-ray diffraction method. As a result, it was confirmed that all molecular planes of a phenothiazine-TCNQ complex were oriented substantially parallel to the substrate surface.

EXAMPLE 10

An ITO transparent electrode having a film thickness of 400 nm and an $SiO_2$ film having a film thickness of 200 nm as an insulating layer were formed on a quartz substrate main body. A monomolecular film containing tetra t-butylphthalocyanine and octadecane at a mixing ratio of 1 : 4 was developed on a water surface, and three layers of this monomolecular film were accumulated on the resultant substrate. A violanthrene film having a film thickness of 3 nm and a phenothiazine-TCNQ film having a film thickness of about 30 nm were formed on the substrate at a substrate temperature of 55° C. by the vacuum deposition method. In addition, a polyisobutylmethacrylate film having a film thickness of 20 nm as an insulating layer and an Au semitransparent electrode having a film thickness of 25 nm were formed on the phenothiazine-TCNQ film to manufacture an organic thin film element.

When no voltage was applied, the organic thin film layer of this element exhibited an orange color. When a voltage was applied to the organic thin film layer, the color of the layer changed to dark red at a voltage of about 30 V.

EXAMPLE 11

An Si substrate main body was left to stand in a bistrichlorosilylpyrene vapor phase for a surface treatment. A TTF-chloranil film having a film thickness of about 30 nm was formed on the resultant substrate by the vacuum deposition method.

When the film was observed by the SEM, it was confirmed that a uniform continuous film in which the size of one domain reached 10 μm was formed. In addition, the orientation of the film was checked by the X-ray diffraction method. As a result, it was confirmed that molecular planes of both the TTF and chloranil molecules were oriented substantially parallel to the substrate surface.

EXAMPLE 12

An ITO transparent electrode having a film thickness of 400 nm and an $SiO_2$ film having a film thickness of 150 nm as an insulating layer were formed on a quartz substrate main body. The resultant substrate was subjected to a surface treatment in a bistrichlorosilylpyrene vapor phase. A TTF-chloranil film having a film thickness of about 30 nm was formed on the substrate by the vacuum deposition method. In addition, a polyisobutylmethacrylate film having a film thickness of 20 nm as an insulating layer and an Au semitransparent electrode having a film thickness of 20 nm were formed on the TTF-chloranil film to manufacture an organic thin film element.

When no voltage was applied, the organic thin film layer of this element exhibited a yellow color. When a voltage was applied to the organic thin film layer, the color of the layer changed to red at a voltage of about 50 V.

EXAMPLE 13

An ITO transparent electrode having a film thickness of 400 nm and an $SrTiO_3$ film having a film thickness of 200 nm as an insulating layer were formed on a quartz substrate main body. The resultant substrate was subjected to a surface treatment in a bistrichlorosilylpyrene vapor phase. A TTF-chloranil film having a film thickness of about 30 nm was formed on the substrate by the vacuum deposition method. In addition, a polyisobutylmethacrylate film having a film thickness of 20 nm as an insulating layer and an Au semitransparent electrode having a film thickness of 20 nm were formed on the TTF-chloranil film to manufacture an organic thin film element.

When no voltage was applied, the organic thin film layer of this element exhibited a yellow color. When a voltage was applied to the organic thin film layer, the color of the layer changed to red at a voltage of about 25 V.

EXAMPLE 14

An Si substrate main body was subjected to a surface treatment in a γ-aminopropyltriethoxysilane vapor phase. Perylenetetracarboxylic dianhydride was deposited on the resultant substrate by the vacuum deposition method, and the substrate was heated up to about 70° C. to cause a condensation reaction and redissociation of non-condensed molecules. Thereafter, a TTF-chloranil film having a film thickness of about 30 nm was formed.

When the film was observed by the SEM, it was confirmed that a uniform continuous film in which the size of one domain reached 10 μm was formed. In addition, the orientation of the film was checked by the X-ray diffraction method. As a result, it was confirmed that molecular planes of both the TTF and chloranil molecules were oriented parallel to the substrate surface.

EXAMPLE 15

An ITO transparent electrode having a film thickness of 400 nm and an SiO$_2$ film having a film thickness of 150 nm as an insulating layer were formed on a quartz substrate main body. The resultant substrate was subjected to a surface treatment in a γ-aminopropyltriethoxysilane vapor phase. Perylenetetracarboxylic dianhydride was deposited on the resultant substrate by the vacuum deposition method, and the substrate was heated up to about 70° C. to cause a condensation reaction and re-dissociation of non-condensed molecules. Thereafter, a TTF-chloranil film having a film thickness of about 30 nm was formed. In addition, a polyisobutylmethacrylate film having a film thickness of 20 nm as an insulating layer and an Au semitransparent electrode having a film thickness of 20 nm were formed on the TTF-chloranil film to manufacture an organic thin film element.

When no voltage was applied, the organic thin film layer of this organic thin film element exhibited a yellow color. When a voltage was applied to the organic thin film layer, the color of the layer changed to red at a voltage of about 50 V.

EXAMPLE 16

An ITO transparent electrode having a film thickness of 400 nm and an SrTiO$_3$ film having a film thickness of 200 nm as an insulating layer were formed on a quartz substrate main body. The resultant substrate was subjected to a surface treatment in a γ-aminopropyltriethoxysilane vapor phase. Perylenetetracarboxylic dianhydride was deposited on the resultant substrate by the vacuum deposition method, and the substrate was heated up to about 70° C. to cause a condensation reaction and re-dissociation of non-condensed molecules. Thereafter, a TTF-chloranil film having a film thickness of about 30 nm was formed. In addition, a polyisobutylmethacrylate film having a film thickness of 20 nm as an insulating layer and an Au semitransparent electrode having a film thickness of 20 nm were formed on the TTF-chloranil film to manufacture an organic thin film element.

When no voltage was applied, the organic thin film layer of this element exhibited a yellow color. When a voltage was applied to the organic thin film layer, the color of the layer changed to red at a voltage of about 25 V.

EXAMPLE 17

A perylenetetracarboxylic dianhydride film having a film thickness of 20 nm was formed on an Si substrate main body, and the resultant substrate was heated up to 550° C. in an argon atmosphere. As a result, most of the film changed to polyperynaphthalene. A phenothiazineTCNQ film having a film thickness of about 30 nm was formed on the resultant substrate at a substrate temperature of 50° C. by the vacuum deposition method.

When the film was observed by the SEM, it was confirmed that a uniform continuous film in which the size of one domain reached 10 μm was formed. In addition, the orientation of the film was checked bythe X-ray diffraction method. As a result, it was confirmed that all molecular planes of a phenothiazine-TCNQ complex were oriented substantially parallel to the substrate surface.

EXAMPLE 18

A perylenetetracarboxylic dianhydride film having a film thickness of 20 nm was formed on an Si substrate main body, and the resultant substrate was heated up to 550° C. in an argon atmosphere. As a result, most of the film changed to polyperynaphthalene. A violanthrene film having a film thickness of about 2 nm and a phenothiazine-TCNQ film having a film thickness of about 30 nm were formed on the resultant substrate at a substrate temperature of 50° C. by the vacuum deposition method.

When the film was observed by the SEM, it was confirmed that a uniform continuous film in which the size of one domain reached 10 μm was formed. In addition, the orientation of the film was checked by the X-ray diffraction method. As a result, it was confirmed that all molecular planes of a phenothiazine-TCNQ complex were oriented substantially parallel to the substrate surface.

EXAMPLE 19

An ITO transparent electrode having a film thickness of 400 nm and an SiO$_2$ film having a film thickness of 200 nm as an insulating layer were formed on a quartz substrate main body. A perylenetetracarboxylic dianhydride film having a film thickness of 20 nm was formed on the resultant substrate, and the substrate was heated up to 550° C. in an argon atmosphere. As a result, most of the film changed to polyperynaphthalene. A violanthrene film having a film thickness of about 3 nm and a phenothiazine-TCNQ film having a film thickness of about 30 nm were formed on the resultant substrate at a substrate temperature of 50° C. by the vacuum deposition method. In addition, a polyisobutylmethacrylate film having a film thickness of 20 nm as an insulating layer and an Au semitransparent electrode having a film thickness of 25 nm were formed on the phenothiazine-TCNQ film to manufacture an organic thin film element.

When no voltage was applied, the organic thin film layer of this element exhibited an orange color. When a voltage was applied to the organic thin film layer, the color of the layer changed to dark red at a voltage of about 30 V.

EXAMPLE 20

An ITO transparent electrode having a film thickness of 400 nm and an $SiO_2$ film having a film thickness of 200 nm as an insulating layer were formed on a quartz substrate main body. A co-deposition film consisting of ovalene and 1,4-benzenedimethylchloride was formed on the resultant substrate, and a polycondensation film was formed in an argon atmosphere containing $PCl_5$ at a substrate temperature of 150° C. A violanthrene film having a film thickness of about 2 nm and a phenothiazine-TCNQ film having a film thickness of about 30 nm were formed on the resultant substrate at a substrate temperature of 50° C. by the vacuum deposition method. In addition, a polyisobutylmethacrylate film having a film thickness of 20 nm as an insulating layer and an Au semitransparent electrode having a film thickness of 25 nm were formed on the phenothiazine-TCNQ film to manufacture an organic thin film element.

When no voltage was applied, the organic thin film layer of this element exhibited an orange color. When a voltage was applied to the organic thin film layer, the color of the layer changed to dark red at a voltage of about 30 V.

EXAMPLE 21

An ITO transparent electrode having a film thickness of 400 nm and an $SiO_2$ film having a film thickness of 200 nm as an insulating layer were formed on a quartz substrate main body. A polyoxadiazole film was formed on the resultant substrate by a cast method, and the substrate was subjected to a heat treatment at 900° C. in a vacuum. A violanthrene film having a film thickness of about 2 nm and a phenothiazine-TCNQ film having a film thickness of about 30 nm were formed on the resultant substrate at a substrate temperature of 50° C. by the vacuum deposition method. In addition, a polyisobutylmethacrylate film having a film thickness of 20 nm as an insulating layer and an Au semitransparent electrode having a film thickness of 25 nm were formed on the phenothiazine-TCNQ film to manufacture an organic thin film element.

When no voltage was applied, the organic thin film layer of this element exhibited an orange color. When a voltage was applied to the organic thin film layer, the color of the layer changed to dark red at a voltage of about 30 V.

EXAMPLE 22

A perylenetetracarboxylic dianhydride film having a film thickness of 50 nm was formed on an Si substrate main body, and an argon ion beam was radiated at an acceleration energy of 3 MeV and a dose of $10^{16}$ cm$^{-2}$ in a vacuum. A phenothiazine-TCNQ film having a film thickness of about 30 nm was formed on the resultant substrate at a substrate temperature of 50° C. by the vacuum deposition method.

When the film was observed by the SEM, it was confirmed that a uniform continuous film in which the size of one domain reached 5 μm was formed. In addition, the orientation of the film was checked by the X-ray diffraction method. As a result, it was confirmed that all molecular planes of a phenothiazine-TCNQ complex were oriented substantially parallel to the substrate surface.

EXAMPLE 23

A perylenetetracarboxylic dianhydride film having a film thickness of 50 nm was formed on an Si substrate main body, and an argon ion beam was radiated at an acceleration energy of 3 MeV and a dose of $16^{16}$ cm$^{-2}$ in a vacuum. A violanthrene film having a film thickness of 2 nm and a phenothiazine-TCNQ film having a film thickness of about 30 nm was formed on the resultant substrate at a substrate temperature of 50° C. by the vacuum deposition method.

When the film was observed by the SEM, it was confirmed that a uniform continuous film in which the size of one domain reached 10 μm was formed. In addition, the orientation of the film was checked by the X-ray diffraction method. As a result, it was confirmed that all molecular planes of a phenothiazine-TCNQ complex were oriented substantially parallel to the substrate surface.

EXAMPLE 24

An ITO transparent electrode having a film thickness of 400 nm and an $SiO_2$ film having a film thickness of 200 nm as an insulating layer were formed on a quartz substrate main body. A perylenetetracarboxylic dianhydride film having a film thickness of 50 nm was formed on the resultant substrate, and an argon ion beam was radiated at an acceleration energy of 3 MeV and a dose of $16^{16}$ cm$^{-2}$ in a vacuum. A violanthrene film having a film thickness of 2 nm and a phenothiazine-TCNQ film having a film thickness of about 30 nm were formed on the resultant substrate at a substrate temperature of 50° C. by the vacuum deposition method. In addition, a polyisobutylmethacrylate film having a film thickness of 20 nm as an insulating layer and an Au semitransparent electrode having a film thickness of 25 nm were formed on the phenothiazine-TCNQ film to manufacture an organic thin film element.

When no voltage was applied, the organic thin film layer of this element exhibited an orange color. When a voltage was applied to the organic thin film layer, the color of the layer changed to dark red at a voltage of about 30 V.

EXAMPLE 25

A diindenoperylene film having a film thickness of 50 nm was formed on an Si substrate main body, and an electron beam was radiated at an acceleration voltage of 20 kV. A violanthrene film having a film thickness of 2 nm and a phenothiazine-TCNQ film having a film thickness of about 30 nm was formed on the resultant substrate at a substrate temperature of 50° C. by the vacuum deposition method.

When the film was observed by the SEM, it was confirmed that a uniform continuous film in which the size of one domain reached 10 μm was formed. In addition, the orientation of the film was checked the X-ray diffraction method. As a result, it was confirmed that all molecular planes of a phenothiazine-TCNQ complex were oriented substantially parallel to the substrate surface.

EXAMPLE 26

An ITO transparent electrode having a film thickness of 400 mn and an $SiO_2$ film having a film thickness of 200 nm as an insulating layer were formed on a quartz substrate main body. A diindenoperylene film having a film thickness of 50 nm was formed on the resultant substrate, and an electron beam was radiated at an acceleration voltage of 20 kV. A violanthrene film having a film thickness of 2 nm and a phenothiazine-TCNQ film having a film thickness of about 30 nm were formed on the resultant substrate at a substrate temperature of 50° C. by the vacuum deposition method. In addition, a polyisobutylmethacrylate film having a film thickness of 20 nm as an insulating layer and an Au semitransparent electrode having a film thickness of 25 nm were formed on the phenothiazine-TCNQ film to manufacture an organic thin film element.

When no voltage was applied, the organic thin film layer of this element exhibited an orange color. When a voltage was applied to the organic thin film layer, the color of the layer changed to dark red at a voltage of about 30 V.

EXAMPLE 27

An ITO transparent electrode having a film thickness of 400 nm and an SiO₂ film having a film thickness of 200 nm as an insulating layer were formed on a quartz substrate main body. A perylenetetracarboxylic dianhydride film having a film thickness of 50 nm was formed on the resultant substrate, and an electron beam was radiated at an acceleration voltage of 20 kV to form a rectangular pattern. The resultant substrate was dipped in tetrahydrofuran to dissolve a film at a non-radiated portion. A violanthrene film having a film thickness of 2 nm and a phenothiazine-TCNQ film having a film thickness of about 30 nm were formed on the resultant substrate at a substrate temperature of 50° C. by the vacuum deposition method. In addition, a polyisobutylmethacrylate film having a film thickness of 20 nm as an insulating layer and an Au semitransparent electrode having a film thickness of 25 nm were formed on the phenothianize-TCNQ film to manufacture an organic thin film element.

In this organic thin film element, when no voltage was applied, the organic thin film layer on the region on which the perylenetetracarboxylic dianhydride film was patterned exhibited an orange color. When a voltage was applied to the organic thin film layer, the color of the layer on the same region changed to dark red at a voltage of about 30 V.

EXAMPLE 28

An Ni film having a film thickness of 50 nm was formed on an Si substrate main body by an electron beam deposition method. The resultant substrate was exposed to ethylene gas for 150 to 300 Langmuir (to be abbreviated to as L hereinafter) or more while being heated up to 850° C., thereby forming a carbon layer similar to graphite on its surface. A TCNQ film having a film thickness of about 100 nm was formed on the resultant substrate by the vacuum deposition method.

When the film was observed by the SEM, it was confirmed that a uniform continuous film in which the size of one domain reached 10 μm was formed. In addition, the orientation of the film was checked by the X-ray diffraction method. As a result, it was confirmed that molecular planes on one side of TCNQ crystal unit cells having a herringbone structure were oriented parallel to the substrate surface.

EXAMPLE 29

A TiC film having a film thickness of 20 nm was formed on an Si substrate main body by a CVD method. The resultant substrate was exposed to ethylene gas for 150 to 300 L or more while being heated up to 850° C., thereby forming a carbon layer similar to graphite on its surface. A TCNQ film having a film thickness of about 100 nm was formed on the resultant substrate by the vacuum deposition method.

When the film was observed by the SEM, it was confirmed that a uniform continuous film in which the size of one domain reached 10 μm was formed. In addition, the orientation of the film was checked by the X-ray diffraction method. As a result, it was confirmed that molecular planes on one side of TCNQ crystal unit cells having a herringbone structure were oriented parallel to the substrate surface.

EXAMPLE 30

An SiO₂ film having a film thickness of 20 nm was formed on the surface of an Si substrate main body by a thermal oxidation method. A TiC film having a film thickness of 20 nm was formed on one surface of the resultant substrate by the CVD method. The resultant substrate was exposed to ethylene gas for 150 to 300 L or more while being heated up to 850° C., thereby forming a carbon layer similar to graphite on the TiC film. A methylphenazine-TCNQ film having a film thickness of about 30 nm was formed on the resultant substrate by the vacuum deposition method. In addition, a polyisobutylmethacrylate film having a film thickness of 20 nm as an insulating layer and an Au semitransparent electrode having a film thickness of 25 nm were formed on the methylphenazine-TCNQ film to manufacture an organic thin film element.

In this organic thin film element, when no voltage was applied, a stretching vibration absorption peak of a CN triple bonding of TCNQ according to a reflecting infrared spectrometry appeared at 2,200 cm$^{-1}$. When a voltage was applied to the layer, the absorption peak was shifted to 2,185 cm$^{-1}$ at about 35 V. This is because the complex caused an ionic-neutral transition upon application of the voltage.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An organic thin film element comprising:
   a substrate; and
   an organic thin film layer formed on said substrate and containing donor and acceptor molecules,
   wherein said substrate comprises a substrate main body and a layer consisting of polycyclic aromatic group molecules or a derivative thereof on a surface of the substrate main body.

2. An element according to claim 1, wherein said organic thin film layer containing donor and acceptor molecules consists of a mixed stacked charge-transfer complex.

3. An element according to claim 1, wherein said layer consisting of polycyclic aromatic group molecules or a derivative thereof is formed by a vacuum deposition method.

4. An element according to claim 1, wherein said layer consisting of polycyclic aromatic group molecules or a derivative thereof is formed by an adsorption method.

5. An element according to claim 1, wherein said layer consisting of a polycyclic aromatic group molecules or a derivative thereof is formed by a Langmuir-Blodgett method.

6. An element according to claim 1, wherein said layer consisting of polycyclic aromatic group molecules or a derivative thereof is formed via a chemical bonding.

7. An element according to claim 1, wherein said layer consisting of polycyclic aromatic group molecules or a derivative thereof is formed by heat polymerization.

8. An element according to claim 1, wherein said substrate is constituted by a transparent substrate main body, a transparent electrode, an insulating layer, and a layer consisting of polycyclic aromatic group molecules or a derivative thereof, and has a structure in which an organic thin film, an insulating layer, and a back electrode are sequentially formed thereon, and exhibits a display function.

9. An element according to claim 8, wherein said organic thin film layer has a superlattice structure and exhibits a multi-value function.

10. An organic thin film element comprising: a substrate; and
an organic thin film layer formed on said substrate and containing donor and acceptor molecules,
wherein said substrate comprises a substrate main body and a carbon layer having a graphite structure on a surface of the substrate main body.

11. An element according to claim 10, wherein said organic thin film layer containing donor and acceptor molecules consists of a mixed stacked charge-transfer complex.

12. An element according to claim 10, wherein said carbon layer having a graphite structure is formed by thermally decomposing hydrocarbon adsorbed on the surface of said substrate main body.

13. An element according to claim 10, wherein said substrate is constituted by a transparent substrate main body, a transparent electrode, an insulating layer, and a carbon layer having a graphite structure, and has a structure in which an organic thin film layer, an insulating layer, and a back electrode are sequentially formed thereon, and exhibits a display function.

14. An element according to claim 13, wherein said organic thin film layer has a superlattice structure and exhibits a multi-value function.

* * * * *